(12) United States Patent
Koishi et al.

(10) Patent No.: US 9,570,905 B2
(45) Date of Patent: Feb. 14, 2017

(54) SEMICONDUCTOR DRIVE APPARATUS

(71) Applicants: Ayuki Koishi, Kani (JP); Yosuke Osanai, Toyota (JP)

(72) Inventors: Ayuki Koishi, Kani (JP); Yosuke Osanai, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 0 days.

(21) Appl. No.: 14/417,976

(22) PCT Filed: Sep. 20, 2013

(86) PCT No.: PCT/JP2013/075468
§ 371 (c)(1),
(2) Date: Jan. 28, 2015

(87) PCT Pub. No.: WO2014/046238
PCT Pub. Date: Mar. 27, 2014

(65) Prior Publication Data
US 2015/0263514 A1    Sep. 17, 2015

(30) Foreign Application Priority Data

Sep. 24, 2012  (JP) .................................. 2012-209985

(51) Int. Cl.
*H02H 9/02*         (2006.01)
*H03K 17/082*       (2006.01)
(Continued)

(52) U.S. Cl.
CPC ................. *H02H 9/02* (2013.01); *H02M 1/08* (2013.01); *H03K 17/0828* (2013.01);
(Continued)

(58) Field of Classification Search
CPC ........... H02H 9/02; H03K 17/163; H02M 1/08
See application file for complete search history.

(56) References Cited

U.S. PATENT DOCUMENTS 6,717,785 B2 * 4/2004 Fukuda ................ H03K 17/168
361/86
7,126,802 B2   10/2006 Ishikawa et al.
(Continued)

FOREIGN PATENT DOCUMENTS

JP     2002-353795 A   12/2002
JP     2011-029818 A   2/2011
(Continued)

Primary Examiner — Thienvu Tran
Assistant Examiner — Tien Mai
(74) Attorney, Agent, or Firm — Oliff PLC

(57) ABSTRACT

A semiconductor drive apparatus includes a first control unit configured, when an overcurrent is detected flowing between a first main electrode and a second main electrode of a switching element, to make a gate of the switching element conductive with a predetermined reference potential, to make a control voltage applied between the gate and the first main electrode lower, and to turn off the switching element; a detection unit configured to detect a current generated accompanying charge or discharge of a feedback capacitance between the gate and the second main electrode; and a second control unit configured, when the overcurrent and the current generated accompanying the charge or discharge of the feedback capacitance are detected, to make a resistance between the gate and the reference potential lower.

10 Claims, 6 Drawing Sheets

(51) Int. Cl.
- *H02M 1/08* (2006.01)
- *H03K 17/16* (2006.01)
- *H02M 1/32* (2007.01)
- *H02M 1/00* (2006.01)

(52) U.S. Cl.
CPC ............ *H03K 17/163* (2013.01); *H02M 1/32* (2013.01); *H02M 2001/0009* (2013.01); *H03K 2217/0027* (2013.01)

(56) References Cited

U.S. PATENT DOCUMENTS

| | | | |
|---|---|---|---|
| 7,327,126 B2 * | 2/2008 | Yoshihara | H03K 17/302 323/271 |
| 2002/0176215 A1 | 11/2002 | Hiyama et al. | |
| 2012/0038392 A1 | 2/2012 | Iwamizu | |
| 2012/0153719 A1 | 6/2012 | Inaba et al. | |

FOREIGN PATENT DOCUMENTS

| | | |
|---|---|---|
| JP | 2012034079 A | 2/2012 |
| JP | 2012-070261 A | 4/2012 |
| JP | 2012-147624 A | 8/2012 |
| JP | 2013-102694 A | 5/2013 |
| JP | 2013-214875 A | 10/2013 |
| JP | 2014-064355 A | 4/2014 |

* cited by examiner

US 9,570,905 B2

SEMICONDUCTOR DRIVE APPARATUS

TECHNICAL FIELD

The present invention relates to a semiconductor drive apparatus that turns off a switching element such as an IBGT when an overcurrent flowing into the switching element is detected.

BACKGROUND ART

Patent Document 1 discloses a semiconductor protection circuit having a high-speed protection circuit that turns off an IGBT when an overcurrent flowing into the IGBT is detected by an overcurrent detection resistor.

RELATED-ART DOCUMENTS

Patent Documents

[Patent Document 1] Japanese Laid-open Patent Publication No. 2002-353795

SUMMARY OF THE INVENTION

Problem to be Solved by Invention

For example, in the conventional technology described above, if a short occurs in which the collector voltage of the IGBT changes greatly (for example, when the IGBT is in an on-state and the collector is shorted to a power supply voltage), a current via a feedback capacitance between the gate and collector of the IGBT flows into the gate, and the gate voltage rises. However, the high speed protection circuit described above lowers the gate voltage only based on the overcurrent detection resistor; and the switching element may not be promptly turned off.

It is an object of the present invention to provide a semiconductor drive apparatus that can promptly cut off an overcurrent flowing into a switching element even if a current by a feedback capacitance flows into the gate.

Means to Solve the Problem

According to at least one embodiment of the present invention, a semiconductor drive apparatus includes a first control unit configured, when an overcurrent is detected flowing between a first main electrode and a second main electrode of a switching element, to make a gate of the switching element conductive with a predetermined reference potential, to make a control voltage applied between the gate and the first main electrode lower, and to turn off the switching element; a detection unit configured to detect a current generated accompanying charge or discharge of a feedback capacitance between the gate and the second main electrode; and a second control unit configured, when the overcurrent and the current generated accompanying the charge or discharge of the feedback capacitance are detected, to make a resistance between the gate and the reference potential lower.

Also, according to at least one embodiment of the present invention, a semiconductor drive apparatus includes a first control unit configured, when an overcurrent is detected flowing between a first main electrode and a second main electrode of a switching element, to make a control voltage applied between the gate of the switching element and the first main electrode lower, to turn off the switching element; a detection unit configured to detect a current generated accompanying charge or discharge of a feedback capacitance between the gate and the second main electrode; and a second control unit configured, when the overcurrent and the current generated accompanying the charge or discharge of the feedback capacitance are detected, to make a decreasing speed of the control voltage faster.

Advantage of the Invention

According to at least one embodiment of the present invention, it is possible to promptly cut off an overcurrent flowing into a switching element even if a current by a feedback capacitance flows into the gate.

MODE FOR CARRYING OUT THE INVENTION

In the following, embodiments of the present invention will be described with reference to the drawings.

[About Semiconductor Drive Apparatus 10]

Figure 1:
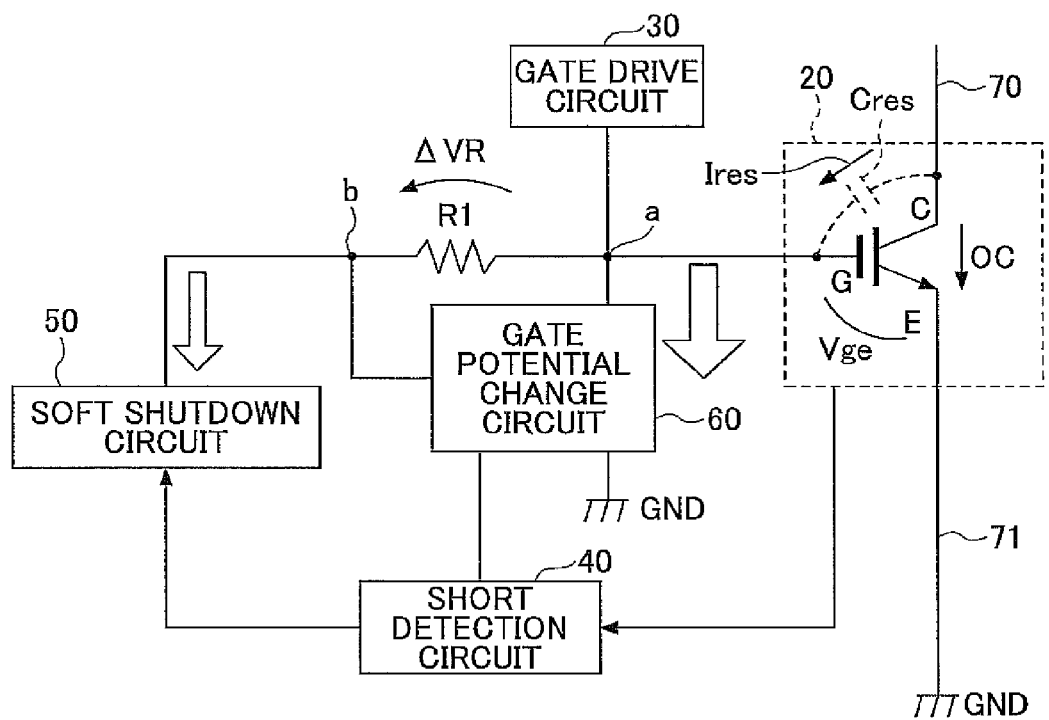
FIG. 1 is an example of a semiconductor drive apparatus.

FIG. 1 is a block diagram illustrating a configuration of a semiconductor drive apparatus 10 according to an embodiment of the present invention. The semiconductor drive apparatus 10 is a circuit that drives a switching element 20, and includes a gate drive circuit 30, a short detection circuit 40, a soft shutdown circuit 50, a resistor R1, and a gate potential change circuit 60. The semiconductor drive apparatus 10 may be configured by an integrated circuit, or may be configured by discrete parts.

The switching element 20 is a semiconductor element that executes turning on/off operations, and is, for example, a voltage-controlled power element, such as an IGBT or a MOSFET, controlled by an insulation gate. FIG. 1 illustrates an IGBT as an example of the switching element 20.

The gate (G) of the switching element 20 is a control electrode connected with a connection point 'a' at which the gate drive circuit 30, the resistor R1, and the gate potential change circuit are connected with each other, and is connected with the soft shutdown circuit 50 via the resistor R1. The emitter (E) of the switching element 20 is a first main electrode connected with a predetermined reference potential (in case of FIG. 1, the ground (GND)) via a current path 71. The collector (C) of the switching element 20 is a second main electrode connected with a power supply voltage via other semiconductor switching elements and loads (not illustrated) on the current path 70.

The switching element 20 may be an N-channel MOSFET. In this case, the gate (G) of the N-channel MOSFET is a control electrode connected with the connection point 'a', and is connected with the soft shutdown circuit 50 via the resistor R1. The source (S) of the N-channel MOSFET is a first main electrode connected with a predetermined reference potential (in case of FIG. 1, the ground (GND)) via the current path 71. The drain (D) of the N-channel MOSFET is a second main electrode connected with the power supply voltage via other semiconductor switching elements and loads (not illustrated) on the current path 70.

The gate drive circuit 30 is a circuit to output a gate drive signal to the gate of the switching element 20, with which the switching element 20 can be switched between on and off. For example, as illustrated in FIG. 1, the gate drive circuit 30 may be connected between the gate of the switching element 20 and the resistor R1. Also, the gate drive circuit 30 may be connected between the soft shutdown circuit 50 and the resistor R1, or may be configured as a circuit that includes the soft shutdown circuit.

The short detection circuit 40 is an overcurrent detection unit to detect an overcurrent OC that flows between the emitter and collector of the switching element 20. By detecting the overcurrent OC, an occurrence of a short fault (for example, a short fault of a semiconductor element or a wiring) can be detected, for example, on the current path 70 connected with the collector of the switching element 20.

The soft shutdown circuit 50 is a first control unit to make the gate of the switching element 20 conductive with the ground to lower the control voltage Vge so that the switching element 20 is turned off when an overcurrent OC is detected by the short detection circuit 40. By making the control voltage Vge applied between the gate and emitter of the switching element 20 lower than the gate threshold voltage of the switching element 20, the switching element 20 can be turned off. The control voltage Vge is a potential difference between the gate and the first main electrode (in case of FIG. 1, the emitter) of the switching element 20, which is also referred to as the "gate voltage".

The soft shutdown circuit 50 is a control unit to lower the control voltage Vge by outputting a low-level signal that is capable of, for example, pulling out (discharging) electric charge of the gate of the switching element 20. For example, the soft shutdown circuit 50 can lower the control voltage Vge by changing the potential of the gate of the switching element 20 down toward the side where the switching element 20 is turned off.

It is preferable that the soft shutdown circuit 50 be a control unit to lower the control voltage Vge, for example, by lowering the total resistance R between the gate of the switching element 20 and the ground via the resistor R1 inserted in series between the gate of the switching element 20 and the ground.

The resistor R1 is a detection unit (current detection part) to detect a current Ires that flows in a feedback capacitance Cres, which exists between the gate and collector of the switching element 20, when an overcurrent OC is generated. The current Ires is a current generated accompanying charged or discharge of the feedback capacitance Cres. When the current Ires flows, a potential difference ΔVR is generated between both terminals of the resistor R1, and depending on the magnitude of the potential difference ΔVR, generation of the current Ires can be detected.

As illustrated in FIG. 1, the resistor R1 is an element connected in series with the gate of the switching element 20, and is preferably inserted in series between the gate of the switching element 20 and the soft shutdown circuit 50.

The gate potential change circuit 60 is a second control unit to make the total resistance R between the gate of the switching element 20 and the predetermined reference potential (in case of FIG. 1, the ground) lower when an overcurrent OC is detected by the short detection circuit 40, and a current Ires is detected by the resistor R1. The gate potential change circuit 60 may be a second control unit to make decreasing speed of the control voltage Vge faster when an overcurrent OC is detected by the short detection circuit 40, and a current Ires is detected by the resistor R1.

The gate potential change circuit 60 may make the total resistance R lower or the decreasing speed of the control voltage Vge faster, for example, by changing the potential of the gate of the switching element 20 down toward the side where the switching element 20 is turned off.

The gate potential change circuit 60 may preferably make the total resistance R lower than the total resistance R lowered by the soft shutdown circuit 50. In case of FIG. 1, the soft shutdown circuit 50 is connected with the gate of the switching element 20 via the resistor R1, whereas the gate potential change circuit 60 is directly connected with the gate of the switching element 20 without the resistor R1. Therefore, the gate potential change circuit 60 can change the potential of the gate of the switching element 20 with a lower impedance than when the soft shutdown circuit 50 makes the total resistance R lower.

Figure 2:
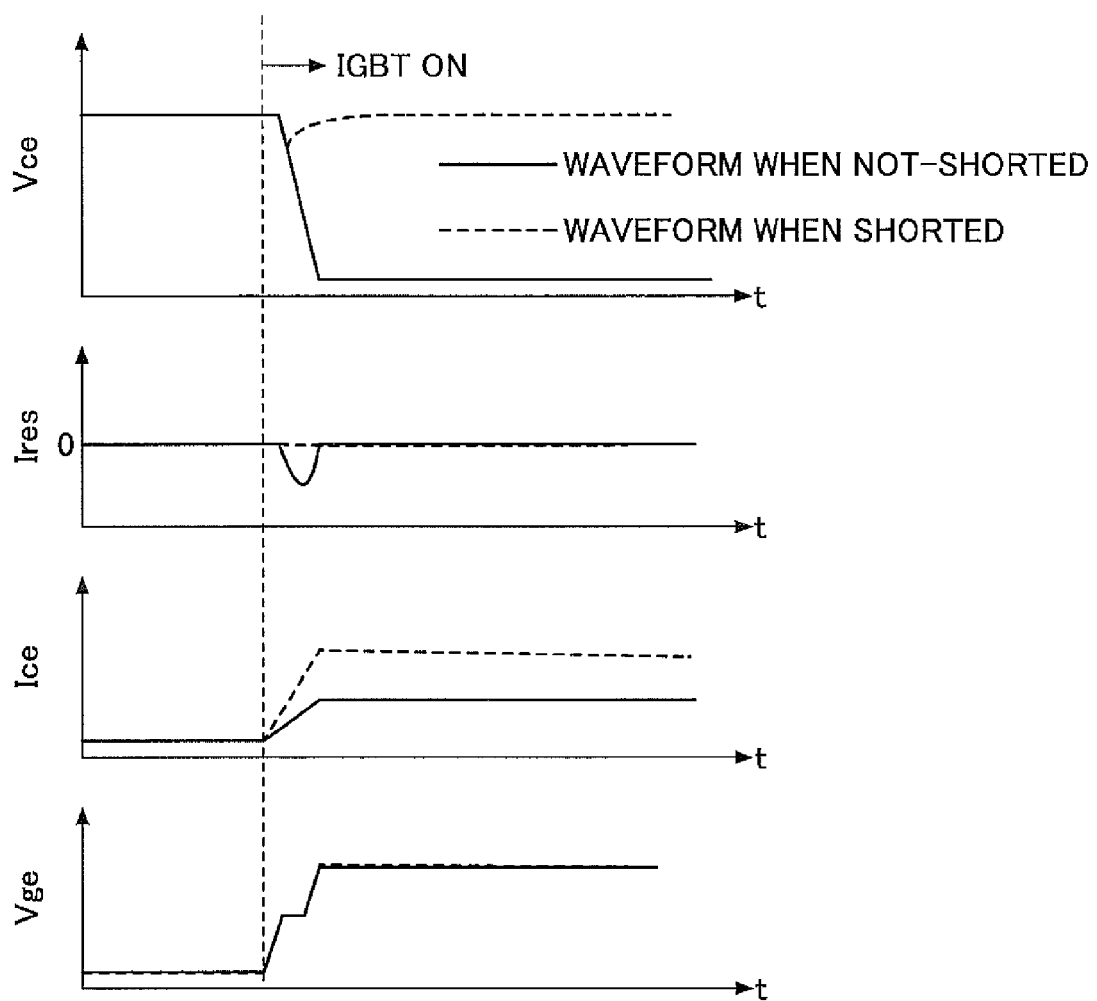
FIG. 2 is a diagram illustrating an example of waveforms when shorted and when not-shorted.
Figure 3:
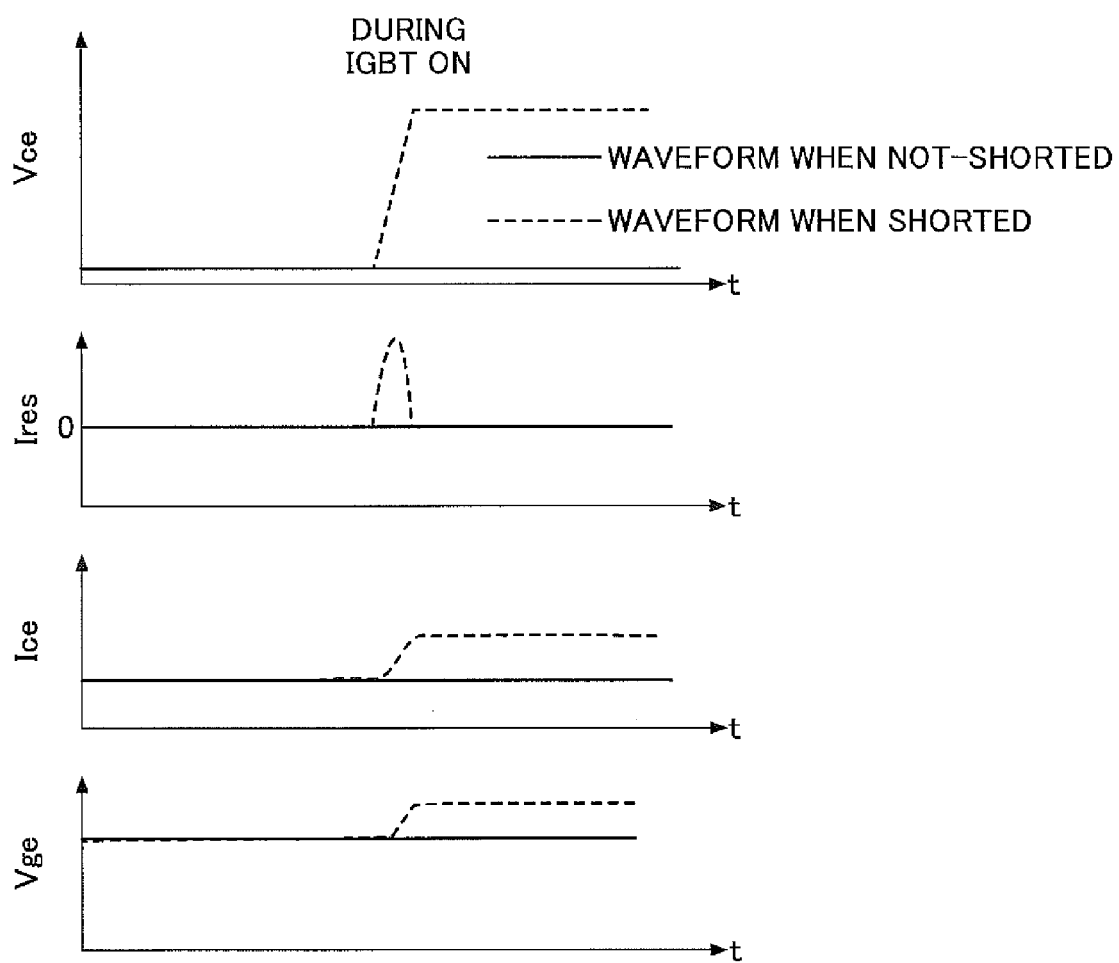
FIG. 3 is a diagram illustrating an example of waveforms when shorted and when not-shorted.

FIG. 2 and FIG. 3 are diagrams illustrating examples of waveforms when shorted and when not-shorted. The short has multiple modes, and among these modes, there is a mode called SCtype1 illustrated in FIG. 2, and a mode called SCtype2 illustrated in FIG. 3.

Note that, in FIG. 2 and FIG. 3, Vice represents the voltage (collector voltage) between the collector and emitter of the switching element 20; Ires represents a current that flows in the feedback capacitance Cres between the gate and collector of the switching element 20; Ice represents a current (collector current) that flows between the collector and emitter of the switching element 20; Vge represents the voltage (gate voltage) between the gate and emitter of the switching element 20; and t represents time.

SCtype1 is a short mode where change of the collector voltage Vce is comparatively small, which occurs, for example, when the collector of the switching element 20 is shorted with the power supply voltage while the switching element 20 is turning on. In case of SCtype1, as illustrated in FIG. 2, while changing speed (dVce/dt) of the collector voltage Vce is kept comparatively small when the switching element 20 is just going to turn on or has turned on, the collector current Ice increases (namely, an overcurrent flows). At this time, virtually no current Ires flows from the collector to the gate of the switching element 20. A momentarily negative change of Ires in FIG. 2 does not represent a current due to the short, but represents a charge current that flows in the feedback capacitance Cres while the switching element 20 is turning on.

On the other hand, SCtype2 is a short mode where change of the collector voltage Vce is comparatively great, which occurs, for example, when the collector of the switching element 20 is shorted with the power supply voltage in a state where the switching element 20 is on. In case of SCtype2, as illustrated in FIG. 3, changing speed (dVce/dt) of the collector voltage Vce rapidly becomes steep soon after the short has occurred, which makes the collector current Ice increase (namely, an overcurrent flows). At this time, the voltage Vge is raised by the current Ires that flows into the gate via the feedback capacitance Cres from the collector of the switching element 20. There are cases where the timing when the current Ires flows is a bit earlier than the timing when the overcurrent is detected.

By detecting the current Ires, the semiconductor drive apparatus 10 in FIG. 1 described above can automatically determine whether the short mode is SCtype1 or SCtype2. Therefore, regardless of the short mode being either mode of the SCtype1 or SCtype2, the semiconductor drive apparatus 10 can promptly protect the switching element 20 from an overcurrent.

For example, when the short mode is SCtype1, an overcurrent OC is detected by the short detection circuit 40. Therefore, since the switching element 20 is promptly turned off by the soft shutdown circuit 50, the overcurrent OC can be promptly cut off, and the period during which the overcurrent OC flows can be shortened. Also, in this case, since the potential difference ΔVR is less than a predetermined threshold, a current Ires is not detected. Therefore, the gate potential change circuit 60 does not function when the short mode is SCtype1. Namely, the total resistance R between the gate of the switching element 20 and the ground lower is not lowered (the decreasing speed of the control voltage Vge is not made faster).

On the other hand, when the short mode is SCtype2, since the overcurrent OC is detected by the short detection circuit 40, the soft shutdown circuit 50 executes an operation to turn off the switching element 20 by making the control voltage Vge lower. Moreover, in this case, the overcurrent OC is detected by the short detection circuit 40, and the flowing current Ires makes the potential difference ΔVR detected by the resistor R1 become greater than or equal to a predetermined threshold. Therefore, the gate potential change circuit 60 executes an operation to make the total resistance R between the gate of the switching element 20 and the ground lower (or to make the decreasing speed of the control voltage Vge faster). This makes the switching element 20 promptly turn off, the overcurrent OC promptly cut off, and the period during which the overcurrent OC flows shortened.

Also, when the short mode is SCtype1, the gate potential change circuit 60 does not function. Therefore, the speed to turn off the switching element 20 can be maintained in a state having been suppressed by the soft shutdown circuit 50, and an off-surge rise of the switching element 20 can be suppressed.

[About Semiconductor Drive Apparatus 11]

Figure 4:
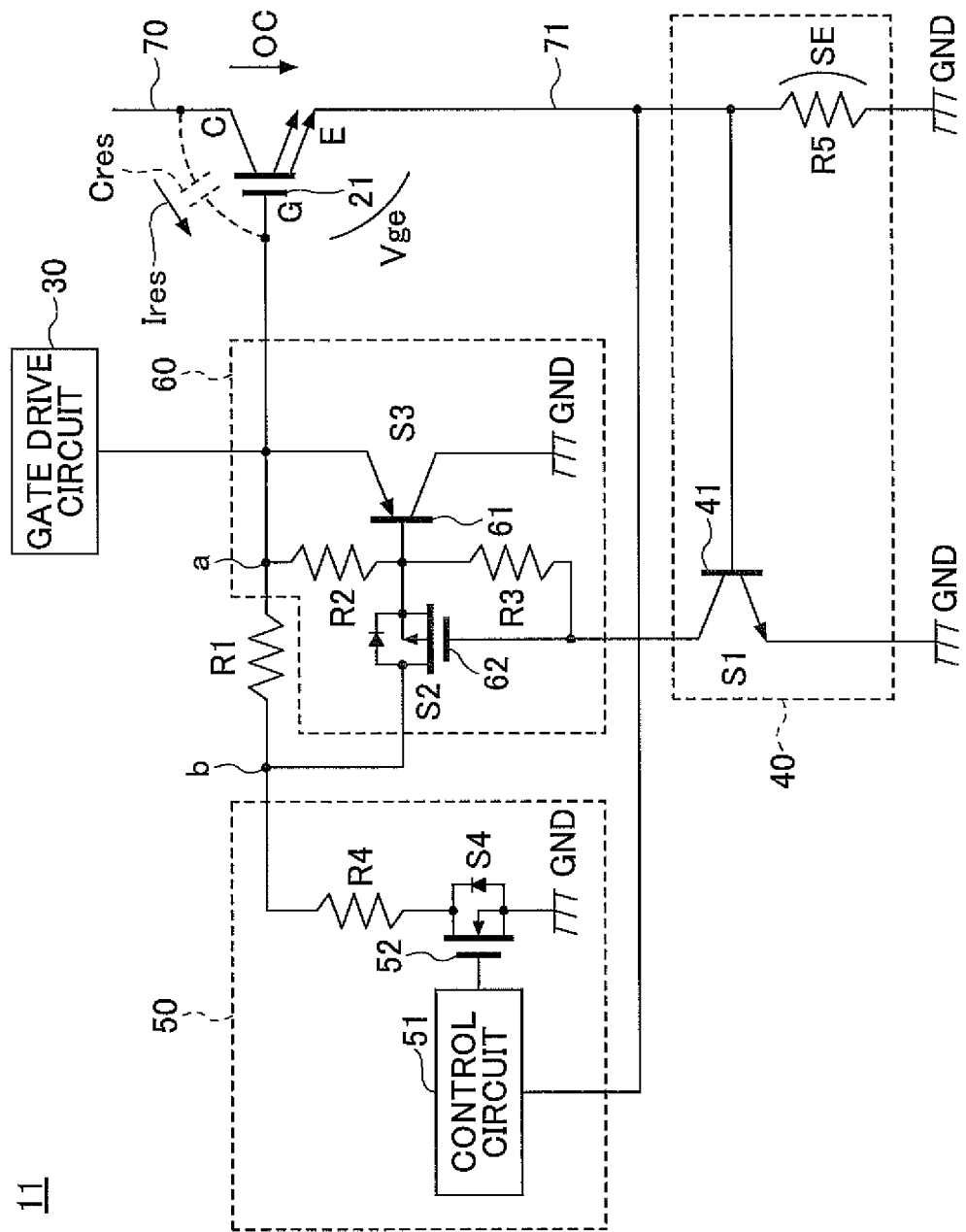
FIG. 4 is an example of a semiconductor drive apparatus.

FIG. 4 is a circuit diagram illustrating a configuration of a semiconductor drive apparatus 11, which is a specific example of the semiconductor drive apparatus 10 in FIG. 1. Description of elements that are substantially the same as those in FIG. 1 will be omitted or simplified.

The semiconductor drive apparatus 11 is a circuit to drive an IGBT 21, and includes a gate drive circuit 30, a short detection circuit 40, a soft shutdown circuit 50, a resistor R1, and a gate potential change circuit 60.

The short detection circuit 40 is an overcurrent detection unit to detect an overcurrent OC that flows between the emitter and collector of the IGBT 21. The short detection circuit 40 detects an overcurrent OC by detecting a current that flows in a resistor R5 inserted in series between the sense emitter (current detection terminal) of the IGBT and the ground.

The short detection circuit 40 includes the resistor R5 and an NPN bipolar transistor 41 having the base connected between the sense emitter of the IGBT 21 and the resistor R5. The NPN bipolar transistor 41 has the emitter connected with the ground, and is connected with the gate of the P-channel MOSFET 62 of the gate potential change circuit 60.

The soft shutdown circuit 50 is a control unit to make the gate of the IGBT 21 conductive with the ground to lower the control voltage Vge so that the IGBT 21 is turned off when an overcurrent OC is detected by the resistor R5 of the short detection circuit 40. The soft shutdown circuit 50 includes a control circuit 51, an N-channel MOSFET 52, and a resistor R4.

The control circuit 51 is a control unit to make the MOSFET 52 turned on when an overcurrent OC is detected by the resistor R5. By making the MOSFET 52 turned on, the gate of the IGBT 21 is connected with the ground via the resistor R1 and resistor R4. This makes the control voltage Vge lower, with which the IGBT 21 can be turned off.

The resistor R1 is a detection unit (current detection part) to detect a current Tres that flows in a feedback capacitance Cres, which exists between the gate and collector of the IGBT 21, when an overcurrent OC is generated.

The gate potential change circuit 60 is a control unit to change the potential of the gate of the switching element 20 downward by lowering the total resistance R between the ground and the gate of the IGBT 21. The gate potential change circuit includes, for example, a PNP bipolar transistor 61, the P-channel MOSFET 62, a resistor R2, and a resistor R3.

The transistor 61 is a first semiconductor element to make the total resistance R lower when being applied with a potential difference ΔVR generated by the current Tres flowing in the resistor R1, which changes the gate potential of the IGBT 21 by making the total resistance R lower. The transistor 61 can discharge the electric charge of the gate of the IGBT 21 to the ground when turned on, with which the difference between the potential of the gate of the IGBT 21 and the ground, or the reference potential of the emitter side, approaches zero.

The MOSFET 62 is a second semiconductor element to allow that the transistor 61 makes the total resistance R lower by detecting the overcurrent OC, which controls the potential difference ΔVR to be applied between the base and emitter of the transistor 61. The MOSFET 62 is turned on when the overcurrent OC is detected by the short detection circuit 40, with the transistor 61 can be turned on to make the total resistance R lowered.

The transistor 61 is an element connected with both terminals 'a' and 'b' of the resistor R1, and the MOSFET 62 is an element inserted between the connection point 'b' on one terminal side of the resistor R1 and the base of the transistor 61. The base, or the control electrode, of the transistor 61 is connected with the source of the MOSFET 62, the emitter, or the first main electrode, of the transistor 61 is connected with the connection point 'a' between the gate of the IGBT 21 and the resistor R1, and the collector, or the second main electrode, of the transistor 61 is connected with the ground. The gate, or the control electrode, of the MOSFET 62 is connected the collector of the transistor 41 of the short detection circuit 40, the source, or the first main electrode, of the MOSFET 62 is connected with the base of the transistor 61, and the drain, or the second main electrode, of the MOSFET 62 is connected with the connection point 'b'. The connection point 'b' is a point between the resistor R4 of the soft shutdown circuit 50 and the resistor R1.

The resistance of the resistor R1 may be set so that the potential difference ΔVR between both terminals 'a' and 'b' of the resistor R1 is less than the forward voltage of a diode between the base and emitter of the transistor 61 in case of SCtype1; and the potential difference ΔVR is greater than or equal to the forward voltage of the diode in case of SCtype2. This can prevent the transistor 61 from erroneously being turned on in case of SCtype1. Therefore, the gate potential change circuit 60 can be prevented from erroneously lowering the total resistance R.

The resistor R2 is an element to prevent the transistor 61 from erroneously turning on. Without the resistor R2, when the transistor 41 and the MOSFET 62 are turned off, since the impedance between the base and emitter of the transistor 61 is high, the voltage between the base and emitter of the transistor 61 becomes undefined. At this moment, if the potential of the emitter of the transistor 61 (the gate of the IGBT 21) rises, a potential difference is generated by an amount of the forward voltage Vf of the diode between the base and emitter of the transistor 61, and the transistor 61 may erroneously turn on. By adding the resistor R2, the impedance between the base and emitter of the transistor 61 can be lowered, which can prevent the transistor 61 from erroneously turning on.

The resistor R3 is an element to prevent the MOSFET 62 from erroneously turning on. Without the resistor R3, the impedance may be high between the gate and source of the MOSFET 62, which makes a potential difference generated between the gate and source of the MOSFET 62, and the MOSFET 62 may erroneously turn on. By adding the resistor R3, the impedance between the gate and source of the MOSFET 62 can be lowered, which can prevent the MOSFET 62 from erroneously turning on.

Note that the resistance of resistor R3 may be set greater than that of the resistor R2 to make only the transistor 41 turn on and not to make the transistor 61 turn on.

Also, the PNP bipolar transistor 61 may be replaced with a P-channel MOSFET. In this case, the P-channel MOSFET has the gate connected with the source of the MOSFET 62, the source, or the first main electrode, connected with the gate of the IGBT 21, and the drain, or the second main electrode, connected with the ground.

Also, in case that the transistor 61 is a PNP bipolar transistor or a P-channel MOSFET, the cathode side of the parasitic diode between the source and drain of the MOSFET 62 is positioned on the base or gate side of the transistor 61. This is because, if the parasitic diode is reversely directed, and the soft shutdown circuit 50 executes a soft shutdown in SCtype1, then a current may flow via the reversely directed parasitic diode, which may erroneously turn on the transistor 61. Therefore, by having the direction in the FIG. 4 coincide with the forward direction of the parasitic diode, and having the output signal of the short detection circuit 40 inverted, the MOSFET 62 may be an N-channel MOSFET.

[Operation of Semiconductor Drive Apparatus 11]

Table 1 is a diagram illustrating states of the elements of the semiconductor drive apparatus 11. S1 represents the on/off state of the transistor 41, S2 represents the on/off state of the MOSFET 62, S3 represents the on/off state of the transistor 61, and S4 represents the on/off state of the MOSFET 52.

TABLE 1

|  | S1 | S2 | S3 | S4 |
| --- | --- | --- | --- | --- |
| NORMAL | OFF | OFF | OFF | OFF |
| SCtype1 | ON | ON | OFF | ON |
| SCtype2 | ON | ON | ON | ON |

Normally (namely, when not-shorted), a function to forcibly turn off the IGBT 21 for protecting from an overcurrent is not activated.

In SCtype1, the transistor 52 is turned on to make a soft shutdown executed. In SCtype2, the transistor 52 is turned on to make a soft shutdown executed. In addition, the transistor 61 is turned on to pull the electric charge out of the gate of the IGBT 21 with a low impedance.

Namely, if the voltage between both terminals SE of the resistor R5 rises when shorted, the transistor 41 is turned on, which makes the MOSFET 62 turn on. In an on-state of the MOSFET 62, if the current Ires flows from the collector to the gate of the IGBT 21, the transistor 61 is turned on, with which the electric charge of the gate of the IGBT 21 can be discharged with the low impedance. Namely, the transistor 61 is not turned on in SCtype1, but turned on only in SCtype2.

The resistance of resistor R3 is set greater than that of the resistor R2 so that the transistor 61 is not turned on just by the transistor 41 being turned on. In SCtype1, when the MOSFET 62 is turned on, since the voltage divided by the resistor R2 and resistor R3 is applied to the base of the transistor 61, the transistor 61 is not erroneously turned on. On the other hand, in SCtype2, when the MOSFET 62 is turned on, the potential difference ΔVR generated between both terminals of the resistor R1 turns on the transistor 61.

[About Semiconductor Drive Apparatus 12]

Figure 5:
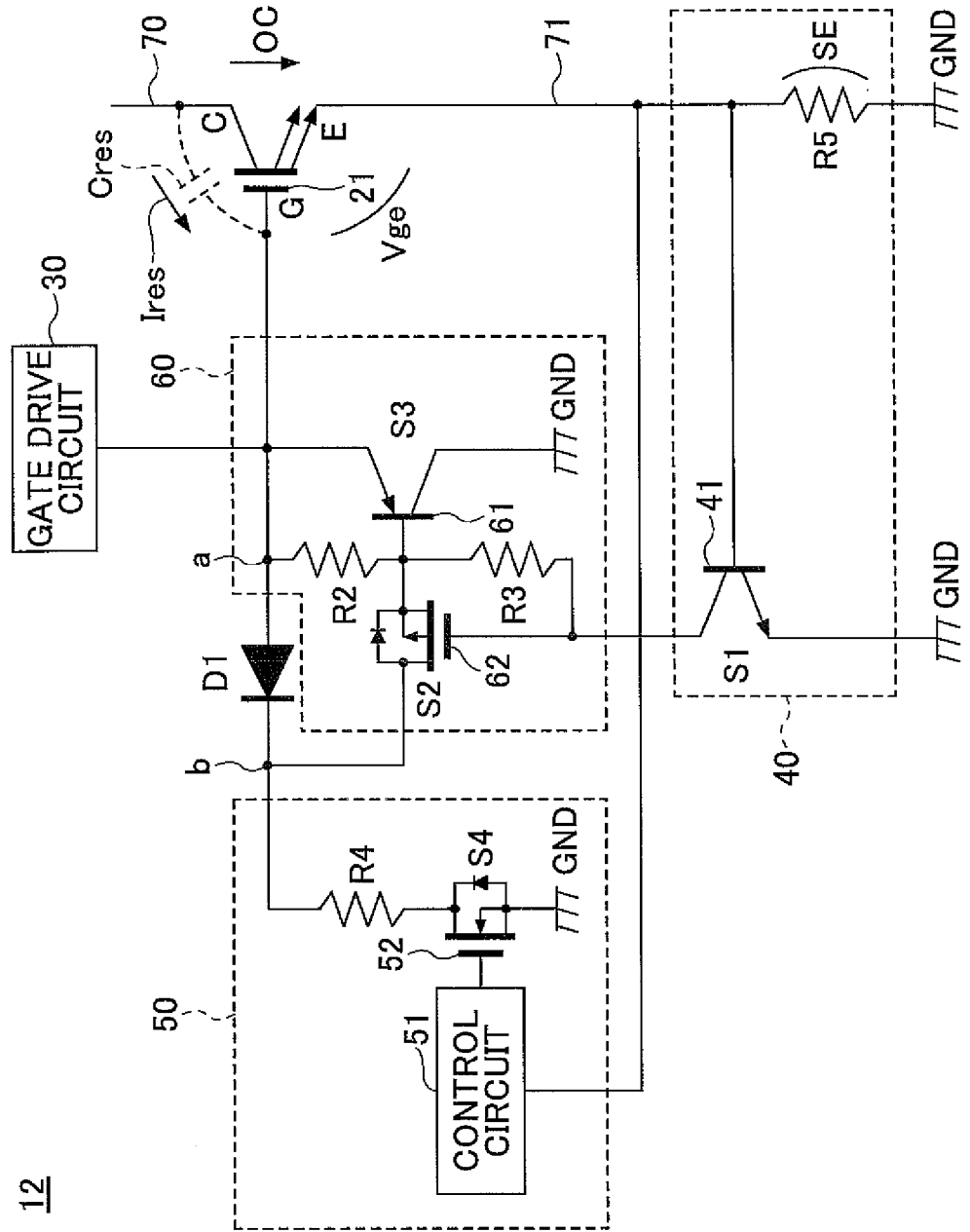
FIG. 5 is an example of a semiconductor drive apparatus.

FIG. 5 is a circuit diagram illustrating a configuration of a semiconductor drive apparatus 12, which is a modified example of the semiconductor drive apparatus 10 in FIG. 1. The semiconductor drive apparatus 12 includes a diode D1, which replaces the resistor R1 of the semiconductor drive apparatus 11 in FIG. 4. Description of elements that are substantially the same as those in FIG. 1 or FIG. 4 will be omitted or simplified.

The diode D1 is a detection unit (current detection part) to detect a current Ires that flows when an overcurrent OC is generated in a feedback capacitance Cres, which exists between the gate and collector of an IGBT 21. The current Ires is a current generated accompanying charge or discharge of the feedback capacitance Cres. When the current Ires flows, a potential difference ΔVR is generated between both terminals of the diode D1, which corresponds to the forward voltage of the diode D1. Therefore, depending on the magnitude of the potential difference ΔVR, generation of the current Ires can be detected.

As illustrated in FIG. 5, the diode D1 is an element that has the anode connected in series with the gate of the switching element and the cathode connected with the resistor R4 of a soft shutdown circuit 50. It is preferable that the diode D1 be an element that has the forward voltage with which the transistor 61 is turned on in SCtype1, but the transistor 61 is not turned on in SCtype2.

Note that the PNP bipolar transistor 61 may be replaced with a P-channel MOSFET, similarly to the semiconductor drive apparatus 11 in FIG. 4. Also, description is omitted for operations of the semiconductor drive apparatus 12 because it is substantially the same as those of the semiconductor drive apparatus 11 in FIG. 4.

[About Semiconductor Drive Apparatus 13]

Figure 6:
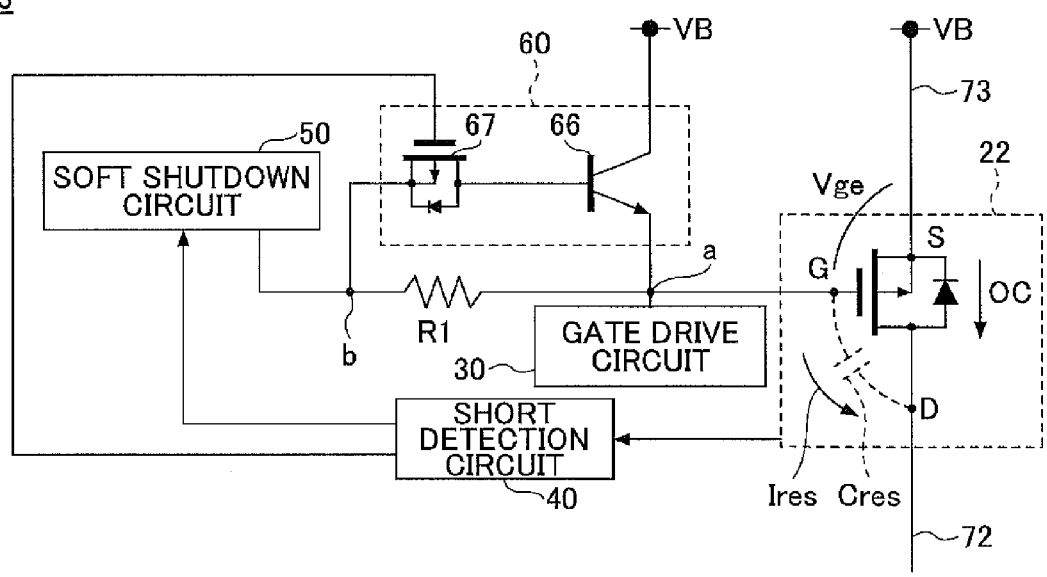
FIG. 6 is an example of a semiconductor drive apparatus.

FIG. 6 is a block diagram illustrating a configuration of a semiconductor drive apparatus 13, which is a specific example of the semiconductor drive apparatus 10 in FIG. 1. In contrast to the semiconductor drive apparatus 10 in FIG. 1, which is a circuit that drives and protects an IGBT or an N-channel MOSFET, the semiconductor drive apparatus 13 in FIG. 6 is a circuit that drives and protects a P-channel MOSFET 22. Description of elements that are substantially the same as those in FIG. 1, FIG. 4, or FIG. 5 will be omitted or simplified.

The gate (G) of the MOSFET 22 is a control electrode connected with a connection point 'a' where a gate drive circuit 30, a resistor R1 and a gate potential change circuit 60 are connected with each other, and is connected with a soft shutdown circuit 50 via the resistor R1. The source (S) of the MOSFET 22 is a first main electrode connected with a predetermined reference potential (in case of FIG. 6, a power supply voltage (VB)) via a current path 73. The drain (D) of the MOSFET 22 is a second main electrode connected with the ground via other semiconductor switching elements and loads (not illustrated) on a current path 72.

The short detection circuit 40 is an overcurrent detection unit to detect an overcurrent OC that flows between the source and drain of the MOSFET 22. By detecting the overcurrent OC, an occurrence of a short fault (for example, a short fault of a semiconductor element or a wiring) can be detected on current path 72 connected with the drain of the MOSFET 22.

The short detection circuit 40 may detect an overcurrent OC by detecting a current that flows in a resistor (not illustrated) inserted in series between the source of the MOSFET 22 and the power supply voltage VB. As a specific example of the short detection circuit 40, for example, a circuit having the inverted polarity with respect to the configuration illustrated in FIG. 4 may be considered.

The soft shutdown circuit 50 is a first control unit to make the gate of the MOSFET 22 conductive with the power supply voltage VB to lower the control voltage Vgs so that the MOSFET 22 is turned off when an overcurrent OC is detected by the short detection circuit 40. By making the control voltage Vgs applied between the gate and source of MOSFET 22 lower than the gate threshold voltage of the MOSFET 22, the MOSFET 22 can be turned off. The control voltage Vgs is a potential difference between the gate and the first main electrode (in case of FIG. 6 the source) of the MOSFET 22, which is also referred to as the "gate voltage".

The soft shutdown circuit 50 is a control unit to lower the control voltage Vgs by outputting a high-level signal that is capable of, for example, injecting (charging) electric charge of the gate of the MOSFET 22. For example, the soft shutdown circuit 50 can lower the control voltage Vgs by changing the potential of the gate of the MOSFET 22 up toward the side where the MOSFET 22 is turned off.

It is preferable that the soft shutdown circuit 50 be a control unit to lower the control voltage Vgs, for example, by lowering the total resistance R between the gate of the MOSFET 22 and the power supply voltage VB via the resistor R1 inserted in series between the gate of the MOSFET 22 and the power supply voltage VB.

As a specific example of the soft shutdown circuit 50, for example, a circuit having the inverted polarity with respect to the configuration illustrated in FIG. 4 may be considered.

The resistor R1 is a detection unit (current detection part) to detect a current Ires that flows when an overcurrent OC is generated in the feedback capacitance Cres, which exists between the gate and drain of the MOSFET 22. The current Tres is a current generated accompanying charge or discharge of the feedback capacitance Cres. When the current Ires flows from the gate to the drain, a potential difference ΔVR is generated between both terminals of the resistor R1. Therefore, depending on the magnitude of the potential difference ΔVR, generation of the current Ires can be detected. This resistor R1 may be replaced with a diode similarly to the above.

The gate potential change circuit 60 is a second control unit to make the total resistance R between the gate of the MOSFET 22 and a predetermined reference potential (in case of FIG. 6, the power supply voltage VB) lower when an overcurrent OC is detected by the short detection circuit 40, and a current Ires is detected by the resistor R1. The gate potential change circuit 60 may be a second control unit to make decreasing speed of the control voltage Vgs faster when an overcurrent OC is detected by the short detection circuit 40, and a current Ires is detected by the resistor R1.

The gate potential change circuit 60 may make the total resistance R lower, or the decreasing speed of the control voltage Vgs faster, for example, by changing the potential of the gate of the MOSFET 22 up toward the side where the MOSFET 22 is turned off.

The gate potential change circuit 60 is a control unit to change the potential of the gate of the MOSFET 22 upward by lowering the total resistance R between the power supply voltage VB and the gate of the MOSFET 22. The gate potential change circuit 60 includes an NPN bipolar transistor 66 and a P-channel MOSFET 67. Similarly to FIG. 4, resistors R2 and R3 may be provided.

The transistor 66 is a first semiconductor element to make the total resistance R lower when being applied with a potential difference ΔVR generated by the current Ires, which changes the gate potential of the MOSFET 22 by making the total resistance R lower. The transistor 66 can charge the gate of the MOSFET 22 by electric charge supplied from the power supply voltage VB when turned on, with which the difference between the potential of the gate of the MOSFET 22 and the power supply voltage VB or the reference potential of the source side approaches zero.

The MOSFET 67 is a second semiconductor element to allow that the transistor 66 makes the total resistance R lower by detecting the overcurrent OC, which controls the potential difference ΔVR applied to the transistor 66. The MOSFET 67 is turned on when the overcurrent OC is detected by the short detection circuit 40, with which the transistor 66 can be turned on to make the total resistance R lowered.

The transistor 66 is an element connected with both terminals 'a' and 'b' of the resistor R1, and the MOSFET 67 is an element inserted between the connection point 'b' on one terminal side of the resistor R1 and the base of the transistor 66. The base, or the control electrode, of the transistor 66 is connected with the drain of the MOSFET 67, the emitter, or the first main electrode, of the transistor 66 is connected with the connection point 'a' between the gate of the MOSFET 22 and the resistor R1, and the collector of the second main electrode of the transistor 66 is connected with the power supply voltage VB. The gate, or the control electrode, of the MOSFET 67 is connected with the short detection circuit 40, the drain, or the second main electrode, of the MOSFET 67 is connected with the base of the transistor 66, and the source, or the first main electrode, of the MOSFET 67 is connected with the connection point 'b'. The connection point 'b' is a point between the soft shutdown circuit 50 and the resistor R1.

Note that the NPN bipolar transistor 66 may be replaced with an N-channel MOSFET. In this case, the N-channel MOSFET has the gate connected with the drain of the MOSFET 67, the source, or the first main electrode, connected with the gate of the MOSFET 22, and the drain, or the second main electrode, connected with the power supply voltage VB.

Also, in case that the transistor 61 is an NPN bipolar transistor or an N-channel MOSFET, the anode side of a parasitic diode between the source and drain of the MOSFET 67 is positioned on the base or gate side of the transistor 66. This is because, if the parasitic diode is reversely directed, and the soft shutdown circuit 50 executes a soft shutdown in SCtype1, then a current may flow via the reversely directed parasitic diode, which may erroneously turn on the transistor 66. Therefore, by having the direction in the FIG. 6 coincide with the forward direction of the parasitic diode, and having the output signal of the short detection circuit 40 inverted, the MOSFET 67 may be an N-channel MOSFET.

Also, description is omitted for operations of the semiconductor drive apparatus 13 because it is substantially the same as those of the semiconductor drive apparatus 11 in FIG. 4.

Although the semiconductor drive apparatus is described with the embodiments as above, the present invention is not limited to the above embodiments. Various modifications and improvements can be made within the scope of the present invention by combining and/or replacing a part of or all of the embodiments with the others.

For example, although an example is described that detects an overcurrent by an overcurrent detection resistor (for example, the resistor R5 in FIG. 4), the overcurrent may be detected by a diode, or may be detected by another overcurrent detection unit.

Also, in FIG. 1, the gate potential change circuit 60 may be a circuit to have the soft shutdown circuit 50 accelerate the speed for lowering the control voltage faster when an overcurrent OC and a current lies are detected.

Also, a switching element driven and protected by an semiconductor drive apparatus according to the present invention may be an upper arm element or a lower arm element included in a push-pull circuit.

This International application is based upon and claims the benefit of priority of the prior Japanese Priority Application No. 2012-209985 filed on Sep. 24, 2012, the entire contents of which are hereby incorporated by reference.

DESCRIPTION OF REFERENCE SYMBOLS

10, 11, 12, 13 semiconductor drive apparatus
20 switching element
21 IGBT
22 MOSFET
30 gate drive circuit
40 short detection circuit
50 soft shutdown circuit
60 gate potential change circuit
70, 71, 72, 73 current path
Ires, current generated accompanying charge or discharge of a feedback capacitance
Cres, feedback capacitance

The invention claimed is:

1. A semiconductor drive apparatus comprising:
   an overcurrent detection unit configured to detect an overcurrent flowing between a first main electrode and a second main electrode of a switching element;
   a first control unit configured, when the overcurrent is detected by the overcurrent detection unit, to make a gate of the switching element conductive with a predetermined reference potential, to make a control voltage applied between the gate and the first main electrode lower, and to turn off the switching element;
   a detection unit configured to detect a current generated accompanying charge or discharge of a feedback capacitance between the gate and the second main electrode, wherein a resistance of the detection unit and the first control unit are in series between the gate and the reference potential; and
   a second control unit configured, when the overcurrent is detected by the overcurrent detection unit, and the current generated accompanying the charge or discharge of the feedback capacitance is detected by the detection unit, to make a resistance between the gate and the reference potential lower, wherein the second control unit makes the resistance lower to a value less than a value obtained when the first control unit lowers the resistance.

2. The semiconductor drive apparatus as claimed in claim 1, wherein the second control unit includes:
   a first semiconductor element configured to make the resistance lower by detecting the current generated accompanying the charge or discharge of the feedback capacitance, and
   a second semiconductor element configured to allow the first semiconductor element to make the resistance lower by detecting the overcurrent.

3. The semiconductor drive apparatus as claimed in claim 2, wherein the first semiconductor element is an element to make the resistance lower when applied with a potential difference generated by the current generated accompanying the charge or discharge of the feedback capacitance charge,
   wherein the second semiconductor element is an element to control applying the potential difference to the first semiconductor element.

4. The semiconductor drive apparatus as claimed in claim 3, wherein the potential difference is a voltage generated by an element connected with the gate.

5. The semiconductor drive apparatus as claimed in claim 4, wherein:
   the first semiconductor element is connected with both terminals of the element, and
   wherein the second semiconductor element is inserted between one terminal of the element and the first semiconductor element.

6. The semiconductor drive apparatus, as claimed in claim 1, wherein the second control unit makes the resistance lower, when the overcurrent is detected by the overcurrent detection unit, and the current generated accompanying the charge or discharge of the feedback capacitance is detected by the detection unit, by a potential difference generated by the current generated accompanying the charge or discharge of the feedback capacitance charge.

7. The semiconductor drive apparatus, as claimed in claim 6, wherein the second control unit includes a transistor to which the potential difference is applied between a base and an emitter of the transistor, and makes the resistance lower when the transistor turns on.

8. A semiconductor drive apparatus, comprising:
   an overcurrent detection unit configured to detect an overcurrent flowing between a first main electrode and a second main electrode of a switching element;
   a first control unit configured, when the overcurrent is detected by the overcurrent detection unit, to make a control voltage applied between the gate of the switching element and the first main electrode lower, to turn off the switching element;
   a detection unit configured to detect a current generated accompanying charge or discharge of a feedback capacitance between the gate and the second main electrode, wherein a resistance of the detection unit and the first control unit are in series between the gate and the reference potential; and
   a second control unit configured, when the overcurrent is detected by the overcurrent detection unit, and the current generated accompanying the charge or discharge of the feedback capacitance is detected by the detection unit, to make a decreasing speed of the control voltage faster, wherein the second control unit makes a decreasing speed of the control voltage when the first control unit lowers the control voltage between the gate of the switching element and the first main electrode.

9. The semiconductor drive apparatus as claimed in claim 8, wherein the second control unit makes the decreasing speed of the control voltage faster, when the overcurrent is detected by the overcurrent detection unit, and the current generated accompanying the charge or discharge of the feedback capacitance is detected by the detection unit, by a potential difference generated by the current generated accompanying the charge or discharge of the feedback capacitance charge.

10. The semiconductor drive apparatus as claimed in claim 9, wherein the second control unit includes a transistor to which the potential difference is applied between a base and an emitter of the transistor, and makes the resistance lower when the transistor turns on.

* * * * *